United States Patent
Lin et al.

(10) Patent No.: US 11,981,990 B2
(45) Date of Patent: May 14, 2024

(54) DEPOSITION EQUIPMENT WITH SHIELDING MECHANISM

(71) Applicant: SKY TECH INC., Hsinchu County (TW)

(72) Inventors: Jing-Cheng Lin, Hsinchu County (TW); Yu-Te Shen, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 102 days.

(21) Appl. No.: 17/899,077

(22) Filed: Aug. 30, 2022

(65) Prior Publication Data

US 2024/0068089 A1    Feb. 29, 2024

(51) Int. Cl.
*H01J 37/34* (2006.01)
*C23C 14/56* (2006.01)

(52) U.S. Cl.
CPC ......... *C23C 14/564* (2013.01); *H01J 37/3488* (2013.01)

(58) Field of Classification Search
CPC ............... H01J 37/3441; H01J 37/3447; H01J 37/32651; C23C 14/34; C23C 14/54; C23C 14/564; C23C 16/4405; C23C 16/4401; H01L 21/6719; H01L 21/68764; H01L 21/68785; H01L 21/68792

USPC ...................................................... 204/298.11
See application file for complete search history.

(56) References Cited

U.S. PATENT DOCUMENTS

| 6,511,585 B1* | 1/2003 | Shi ..................... H01J 37/32055 |
| | | 118/723 VE |
| 2004/0182698 A1* | 9/2004 | Feltsman .............. C23C 14/566 |
| | | 204/298.11 |
| 2019/0316251 A1* | 10/2019 | Tsai ........................ C23C 14/52 |

* cited by examiner

*Primary Examiner* — Rodney G McDonald
(74) *Attorney, Agent, or Firm* — Chun-Ming Shih; HDLS IPR SERVICES

(57) ABSTRACT

The invention provides a deposition equipment with a shielding mechanism, which includes a reaction chamber, a carrier, a cover ring and a shielding mechanism. The shielding mechanism includes a first bearing arm, a second bearing arm, a first shielding plate and a second shielding plate. The first and second shielding plates are respectively placed on the first and second bearing arms. There are corresponding alignment units between the lower surface of the first and second shielding plates and the upper surface the carrier, so that the first and second shielding plates can be aligned with the carrier. There is also a corresponding alignment unit between the upper surface of the first and second shielding plates and the lower surface the cover ring, so that the cover ring can be aligned with the first and second shielding plates to define a cleaning space in the reaction chamber.

20 Claims, 10 Drawing Sheets

DEPOSITION EQUIPMENT WITH SHIELDING MECHANISM

BACKGROUND

Technical Field

The invention relates to a deposition equipment having a shielding mechanism. The shielding mechanism is configured to shield a carrier avoid contamination of the carrier during the cleaning process.

Related Art

A deposition apparatus, such as a chemical vapor deposition (CVD) apparatus, a physical vapor deposition (PVD) apparatus or an atomic-layer deposition (ALD) apparatus, is commonly employed in manufacturing of integrated circuits, light-emitting diodes and displays, etc.

A deposition equipment mainly includes a chamber and a substrate carrier, wherein the substrate carrier is within the chamber for carrying at least one substrate. To exemplify by PVD, a target material is required to dispose within the chamber, wherein the target material faces the substrate on the substrate carrier. When performing PVD, noble gas or reactive gas is transferred into the chamber, then bias electricity is applied on the target material and the substrate carrier respectively, also the substrate carried on by the substrate carrier is heated up.

The noble gas or reactive gas within the chamber transforms into ionized gas in effect of a high-voltage electric field, and then the ionized gas is attracted by the bias electricity to bombard the target material. Thereby, atoms or molecules splashed from the target material are attracted by the bias electricity on the substrate carrier, then be deposited on surface of the substrate and forms a thin film on the surface of the substrate.

After some time of usage, an inner surface of the chamber may also be formed with thin film, and then a periodic cleaning is required to perform to the chamber, in order to prevent the waste thin film from dropping onto the substrate and causing pollution during the process of thin-film deposition. Moreover, surface of the target material may be formed with oxide or other pollutant, therefore requires a periodic cleaning as well. Generally, a burn-in process is applied to bombard the target material within the chamber by plasma ions, then to remove the oxides or pollutants on the surface of target material.

To perform the abovementioned cleaning process, the substrate carrier and the substrate must be extracted or kept out, to prevent the removed pollutant from turning to pollute the substrate carrier and the substrate, during the cleaning process.

SUMMARY

Generally, after some time of usage, the deposition equipment is required for cleaning, in order to remove the thin film within the chamber and the oxide or nitride on the target material. During the cleaning process, some removed pollutant particles may turn to pollute the carrier, and thus there is a need to keep out the carrier from the removed pollutant. This disclosure provides an deposition equipment with a shielding mechanism, which mainly employs a driving device to swing two shielding plates in opposite angular directions to approach or leave each other, such that to operate between a shielding state and an open state. The shielding plates operating in the shielding state can be placed on the carrier, and the shielding plates and the carrier are aligned through alignment structures, so that the shielding plates can reliably shield the carrier.

An object of the disclosure is to provide a deposition equipment with a shielding mechanism, which includes a reaction chamber, a carrier and a shielding mechanism. The shielding mechanism includes a driving device, two bearing arm, and two shielding plates, wherein the driving device connects to the two shielding plates via the two bearing arms, and drives the two shielding plates to swing in opposite directions respectively, so that the two shielding plates operate in an open state or a shielding state.

Two sets of different alignment units are arranged on the lower surface of the shielding plate and one set of alignment units is configured to align the shielding plate with the bearing arm, so that the shielding plate will be guided to the preset position of the bearing arm. The other set of alignment units is configured to align the shielding plate with the carrier, so that the shielding plate will be guided to the preset position of the carrier.

An object of the invention is to provide a deposition equipment with a shielding mechanism. A blocking member and a cover ring are provided in the reaction chamber, and the cover ring is placed on the blocking member. The upper surface of the shielding plate and the lower surface of the cover ring have corresponding alignment units. When the carrier carries the shielding plate to approach the cover ring, the shielding plate and the cover ring can be aligned through the alignment units. The shielding plate and the cover ring are configured to define a cleaning space in the containing space of the reaction chamber. Thereafter, a burn-in process can be performed in the cleaning space to clean the target material and the reaction chamber, blocking member and/or cover ring in the cleaning space.

The two bearing arms are respectively connected to an arc support frame, and carry the shielding plates via the arc support frame. When the two shielding plates operate in shielding state, the two arc support frames form a ring-shaped support frame, and an opening is formed on the inner side of the two arc support frames. The area of the opening is larger than the cross-sectional area of the carrier or the area of the bearing surface, so that the carrier can pass through the opening of the ring-shaped support frame, and carry the shielding plates away from the arc support frames. During the above process, it is not necessary to drive the two bearing arms and the arc-shaped support frame to swing, which is beneficial to improve the convenience in use.

To achieve the object, this disclosure provides a deposition equipment with a shielding mechanism, which comprises: a reaction chamber including a containing space; a carrier located in the containing space, and including a bearing surface and a plurality of alignment protrusion portions, wherein the bearing surface is configured to carry at least one substrate, and the alignment protrusion portions are located around the bearing surface; a shielding mechanism; and a driving device. The shielding mechanism comprises: a first bearing arm located in the containing space, and including a plurality of first alignment portions; a second bearing arm located in the containing space, and including a plurality of second alignment portions; a first shielding plate including a first arc groove or a first arc protrusion located on an upper surface of the first shielding plate, and plurality of third alignment portions and a plurality of first alignment concave portions located on a lower surface of the first shielding plate, wherein the first alignment portions are located on an inner sider of the third alignment portions, and the third alignment portions and the first alignment portions are configured to align the first shielding plate with the first bearing arm; and a second shielding plate including a second arc groove or a second arc protrusion located on an upper surface of the second shielding plate, and plurality of fourth alignment portions and a plurality of second alignment concave portions located on a lower surface of the second shielding plate, wherein the second alignment portions are located on an inner sider of the fourth alignment portions, and the fourth alignment portions and the second alignment portions are configured to align the second shielding plate with the second bearing arm. Further, the driving device is connected to the first bearing arm and the second bearing arm, and drives the first shielding plate and the second shielding plate to swing in opposite directions through the first bearing arm and the second bearing arm respectively, so that the first shielding plate and the second shielding plate are operated in an open state or a shielding state. The first shielding plate and the second shielding plate operating in the shielding state are respectively aligned with the alignment protrusion portions of the carrier through the first alignment concave portions and the second alignment concave portions to shields the bearing surface of the carrier.

BRIEF DESCRIPTION OF THE DRAWINGS

This disclosure will become more fully understood from the detailed description given herein below for illustration only, and thus not limitative of this disclosure, wherein.

DETAILED DESCRIPTION

Figure 1:
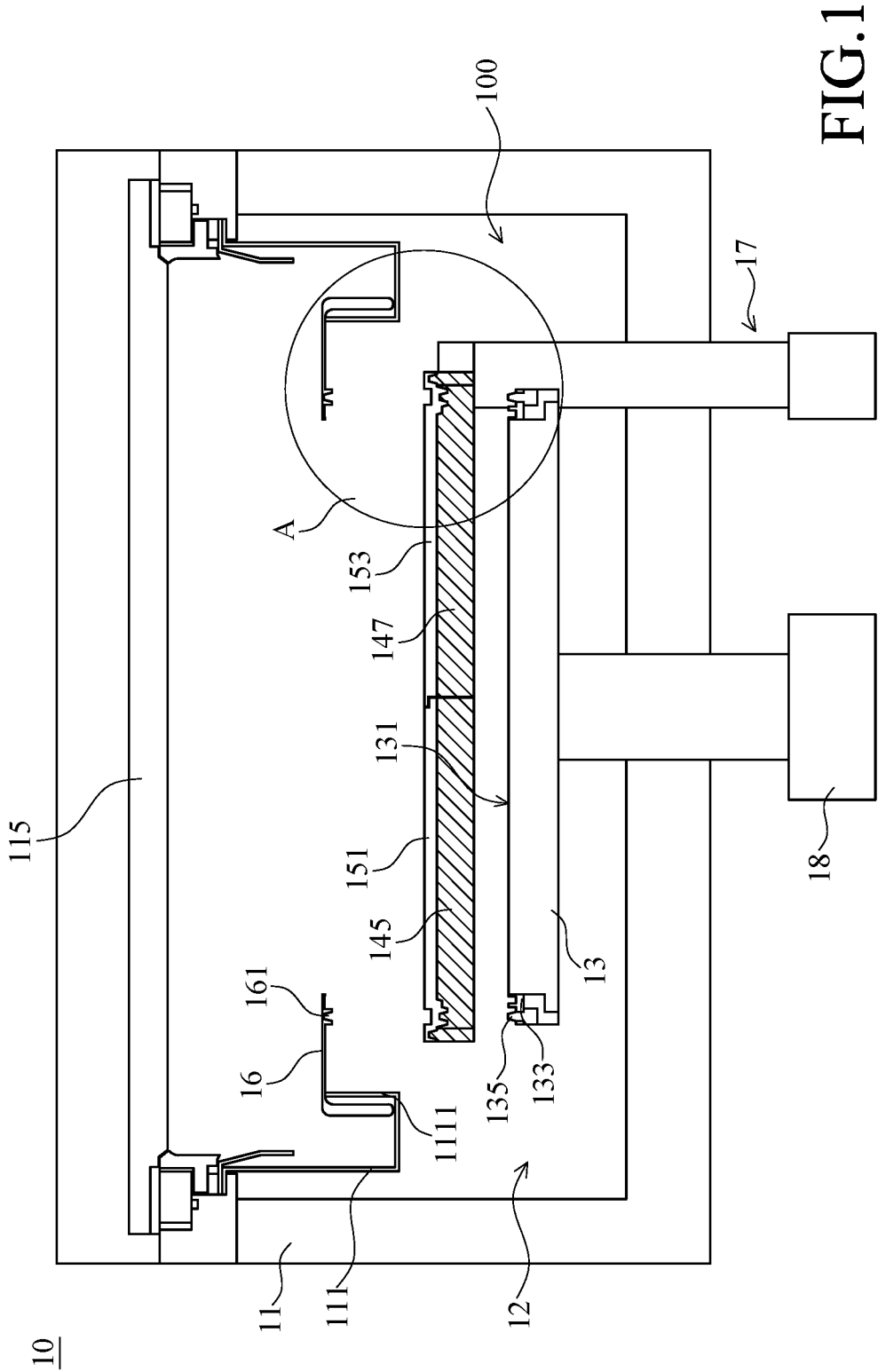
FIG. 1 is a cross section view of a deposition equipment with a shielding mechanism operated in a shielding state according to one embodiment of this disclosure.

FIG. 1 is a schematic sectional view of a deposition equipment with a shielding mechanism operating in a shielding state according to an embodiment of this disclosure. The deposition equipment 10 includes a reaction chamber 11, a carrier 13 and a shielding mechanism 100, wherein the reaction chamber 11 includes a containing space 12 for accommodating the carrier 13 and part of the shielding mechanism 100.

The carrier 13 is located in the containing space 12 of the reaction chamber 11. The carrier 13 includes a bearing surface 131 for carrying at least one substrate. As the deposition equipment 10 is a physical vapor deposition chamber, a target material 115 is disposed in the reaction chamber 11, wherein the target material 115 faces the carrier 13. For example, the target material 115 may be disposed on the upper surface of the reaction chamber 11 and face the bearing surface 131 of the carrier 13 and/or the substrate.

Figure 2:
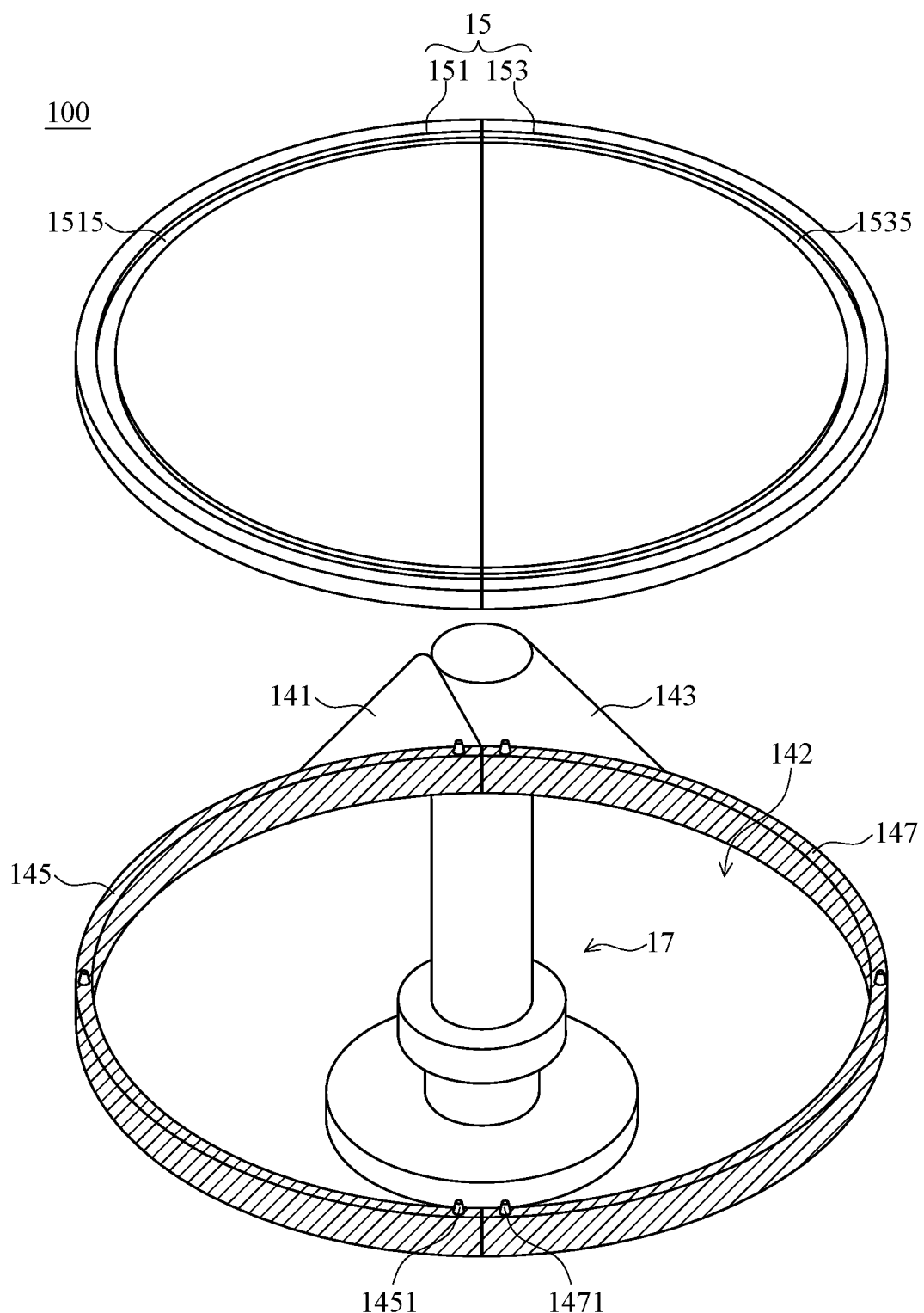
FIG. 2 is a schematic three-dimensional exploded view of the shielding mechanism according to an embodiment this disclosure.
Figure 3:
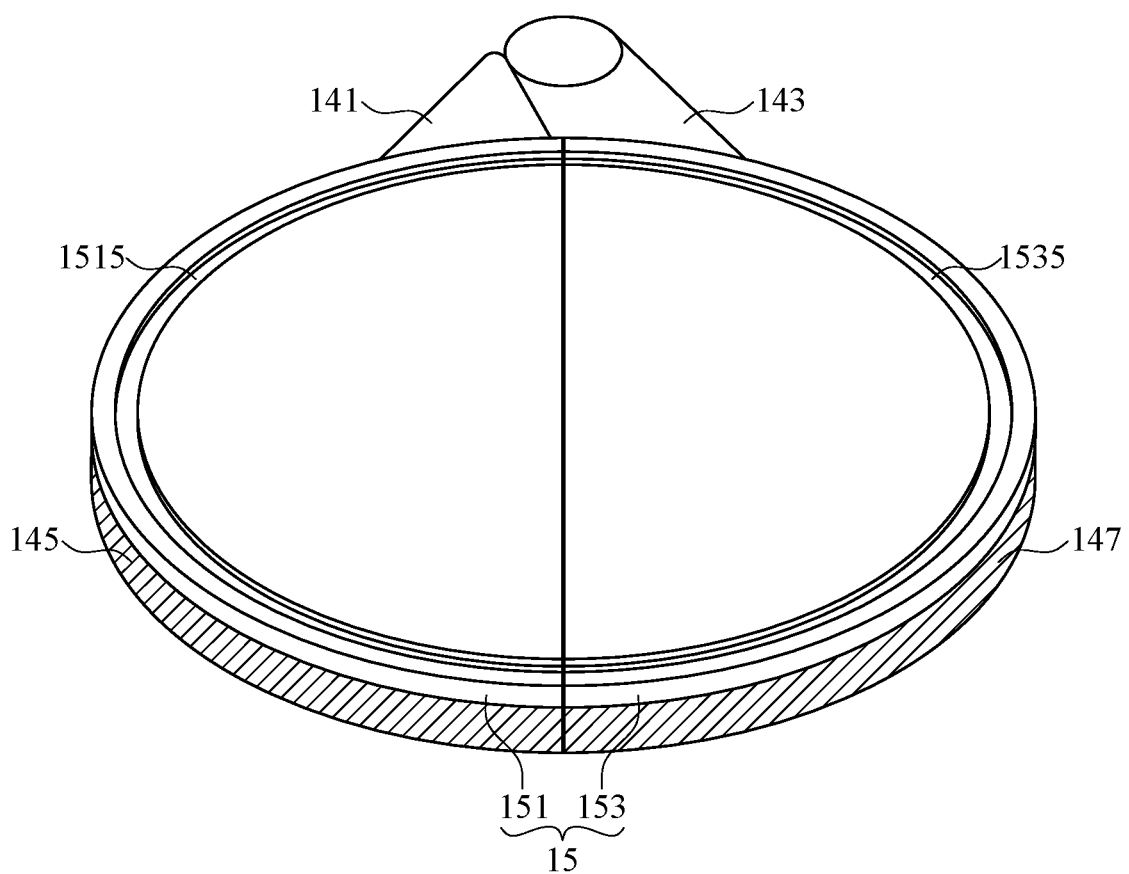
FIG. 3 is a schematic three-dimensional diagram of the shielding mechanism according to an embodiment of this disclosure.

Please refer to FIG. 2 and FIG. 3, the shielding mechanism 100 includes a first bearing arm 141, a second bearing arm 143, a first shielding plate 151, a second shielding plate 153 and a driving device 17, wherein the first bearing arm 141, the second bearing arm 143, the first shielding plate 151 and the second shielding plate 153 are located in the containing space 12. The driving device 17 is connected to the first bearing arm 141 and the second bearing arm 143, and the first bearing arm 141 and the second bearing arm 143 are configured to bear the first shielding plate 151 and the second shielding plate 153 respectively. The driving device 17 is configured to drive the first shielding plate 151 and the second shielding plate 153 to swing in opposite directions through the first bearing arm 141 and the second bearing arm 143, respectively. For example, the first bearing arm 141 and the second bearing arm 143 swing synchronously in opposite directions with the driving device 17 as the axis.

In one embodiment of the invention, the first bearing arm 141 includes a first arc support frame 145, and the second bearing arm 143 includes a second arc support frame 147. The first arc support frame 145 and the second arc support frame 147 are configured to carry the first shielding plate 151 and the second shielding plate 153 respectively. The driving device 17 is configured to drive the first arc support frame 145 and the second arc support frame 147 to swing through the first bearing arm 141 and the second bearing arm 143 respectively, so that the first arc shaped support frame 145 and the second arc shaped support frame 147 are close to or away from each other, and operate in an open state or a closed state. For example, the first arc support frame 145 and the second arc support frame 147 may be semi-annular. When the first shielding plate 151 and the second shielding plate 153 operate in the shielding state, the first arc support frame 145 and the second arc support frame 147 will form a ring-shaped support frame, and an opening 142 will be formed on the inner side of the first arc support frame 145 and the second arc support frame 147.

The first bearing arm 141 includes a plurality of first alignment portions 1451, and the second bearing arm 143 includes a plurality of second alignment portions 1471. For example, the first alignment portions 1451 may be disposed on the upper surface of the first arc support frame 145, and the second alignment portions 1471 may be disposed on the upper surface of the second arc support frame 147.

Figure 4:
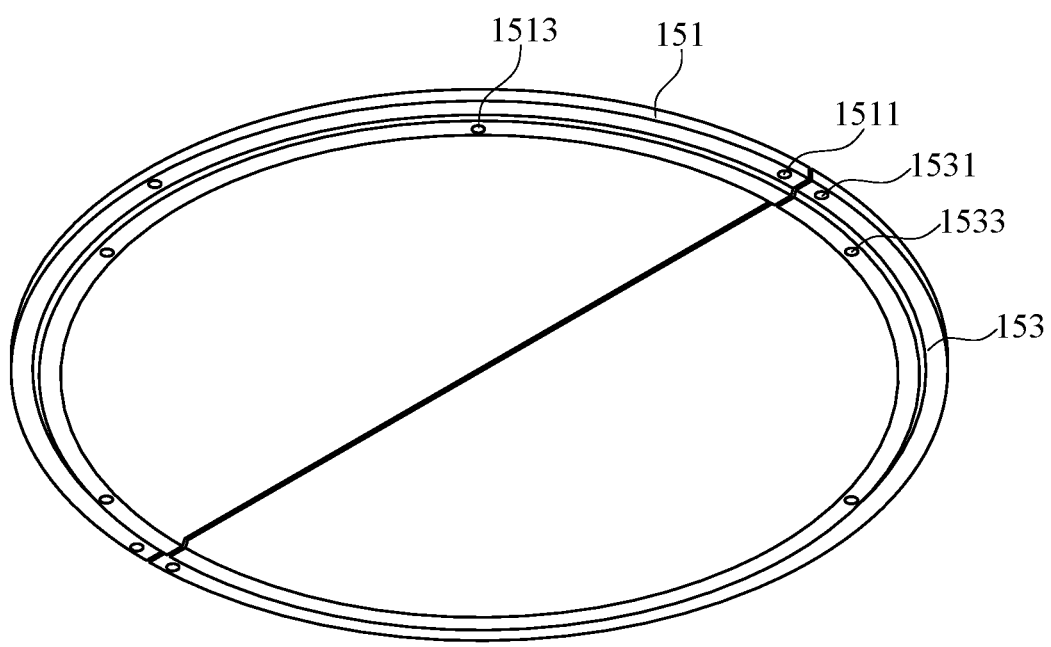
FIG. 4 is a schematic three-dimensional diagram of shielding plates of the shielding mechanism according to an embodiment of this disclosure.
Figure 5:
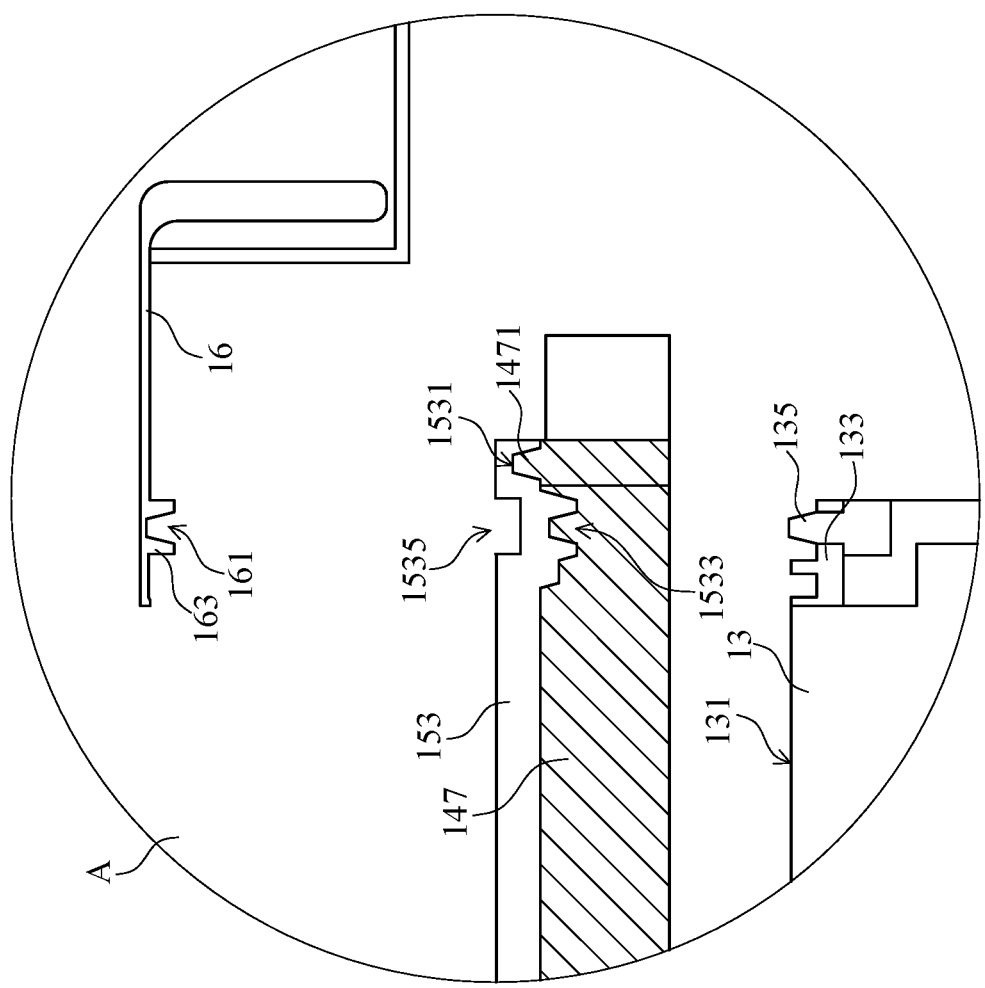
FIG. 5 is an enlarged cross section view of the deposition equipment according to an embodiment of this disclosure.

As shown in FIG. 4 and FIG. 5, the lower surface of first shielding plate 151 may be provided with a plurality of third alignment portions 1511 and a plurality of first alignment concave portions 1513, wherein the first alignment concave portions 1513 are located inner side of the third alignment portions 1511. A plurality of fourth aligning portions 1531 and a plurality of second alignment concave portions 1533 may be disposed on the lower surface of the second shielding plate 153, wherein the second alignment concave portions 1533 are located inner side of the fourth aligning portions 1531.

Specifically, the third alignment portions 1511 and the first alignment portions 1451 are corresponding structures, and are configured to align the first shielding plate 151 with the first bearing arm 141 or the first arc support frame 145. The fourth aligning portions 1531 and the second aligning portions 1471 are corresponding structures, and are configured to align the second shielding plate 153 with the second bearing arm 143 or the second arc support frame 147. For example, the first alignment portions 1451 and the second alignment portions 1471 may be a cone protruding from the first arc support frame 145 and the second arc support frame 147 respectively, and the third alignment portions 1511 and the fourth aligning portions 1531 may be a conical groove disposed on the lower surfaces of the first shielding plate 151 and the second shielding plate 153 respectively.

The first alignment portion 1451 and the second alignment portion 1471 are the cone, while the third alignment portion 1511 and the fourth aligning portion 1531 are the conical groove, which is only an embodiment of the invention. In other embodiments, the first alignment portion 1451 and the second alignment portion 1471 are the conical groove, and the third alignment portion 1511 and the fourth alignment portion 1531 are the cone.

Figure 6:
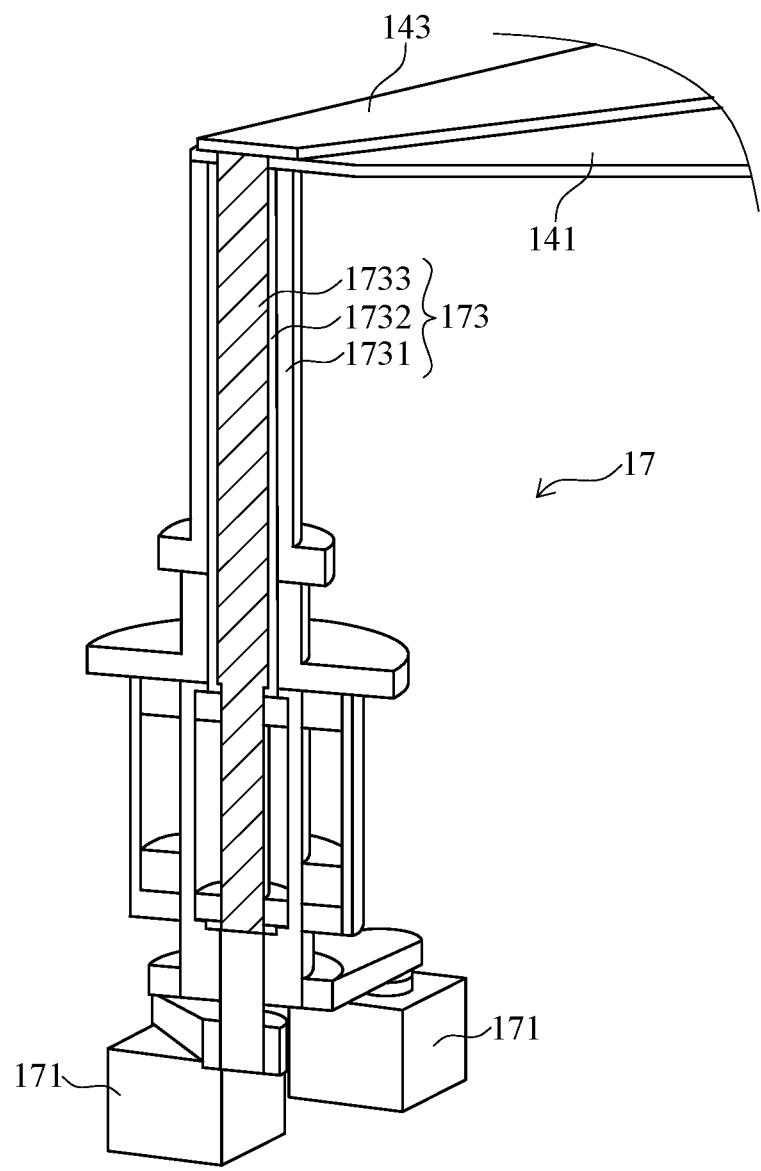
FIG. 6 is a cross section view of a driving device of the deposition equipment according to an embodiment of this disclosure.

In one embodiment of the invention, as shown in FIG. 6, the driving device 17 may include at least a motor 171 and a shaft seal 173, wherein the motor 171 is connected to the first bearing arm 1411 and the second bearing arm 143. The motor 171 is located outside the containing space 12 of the reaction chamber 11. The shaft seal 173 passes through the reaction chamber 11, and part of the shaft seal 173 is located in containing space 12 of the reaction chamber 11.

The shaft seal 173 includes an outer tube 1731 and an inner shaft 1733. The outer tube 1731 includes an inner space 1732 for accommodating the inner shaft 1733, wherein the outer tube 1731 and the inner shaft 1733 are coaxially arranged, and the outer tube 1731 and the inner shaft 1733 can rotate relative to each other. The outer tube 1731 is connected to the first bearing arm 141 to drive the first shielding plate 151 to swing, and the inner shaft 1733 is connected to the second bearing arm 143 to drive the second shielding plate 153 to swing.

The shaft seal 173 is used to isolate the containing space 12 of the reaction chamber 11 from the external space, so as to maintain the vacuum of the containing space 12. In another embodiment of the invention, the shaft seal 173 may be a magnetic fluid shaft seal.

Figure 7:
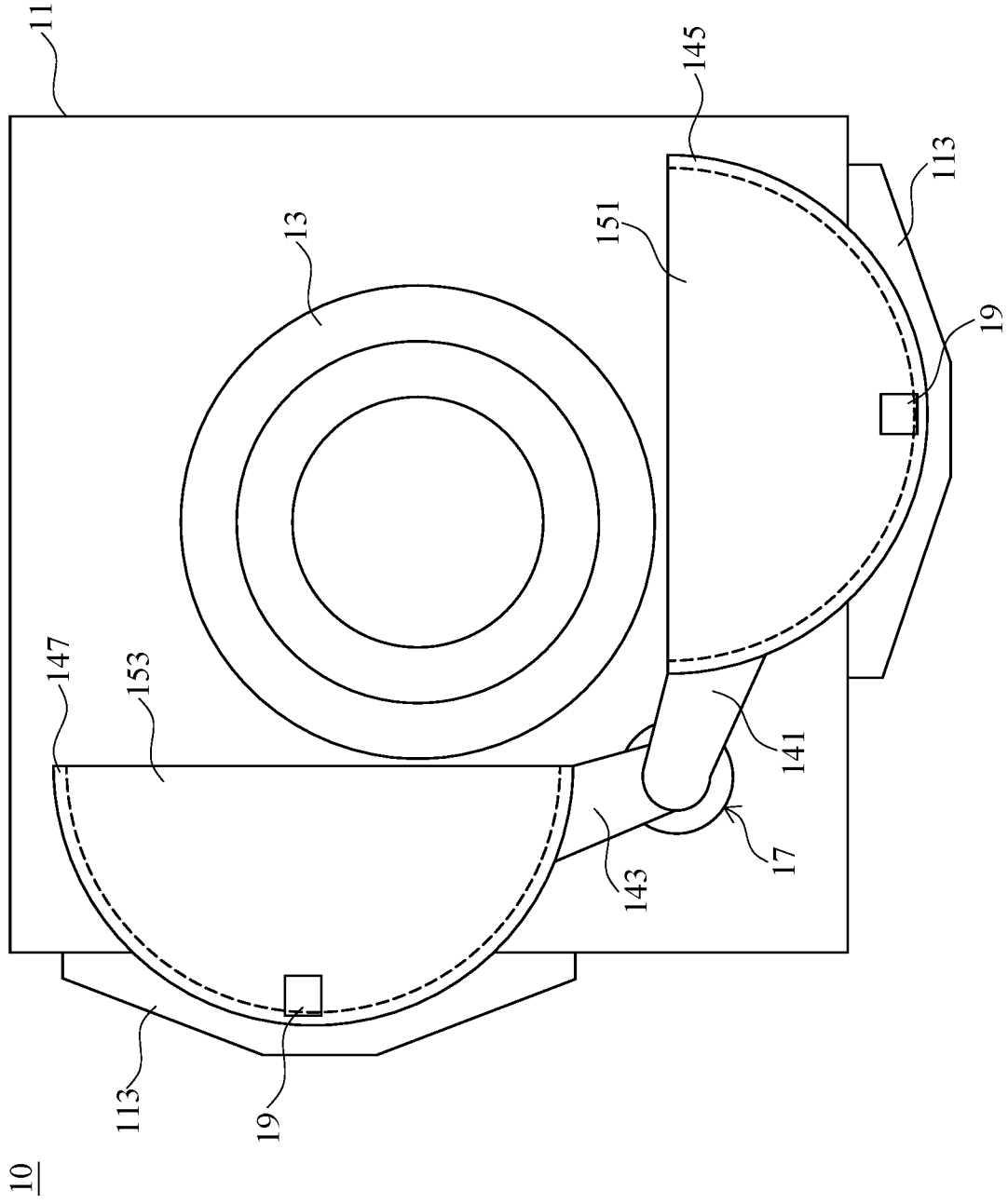
FIG. 7 is a top view of the deposition equipment operating in an open state according to an embodiment of this disclosure.

Specifically, the thin film deposition equipment 10 and/or the shielding mechanism 100 of the invention can operate in two states, namely an open state and a shielding state. As shown in FIG. 7, the driving device 17 is configured to drive the first shielding plate 151 and the second shielding plate 153 away from each other and operate in an open state. Thus, a separate space is formed between the first shielding plate 151 and the second shielding plate 153 operating in the open state, and the target material 115 will face the carrier 13.

Figure 8:
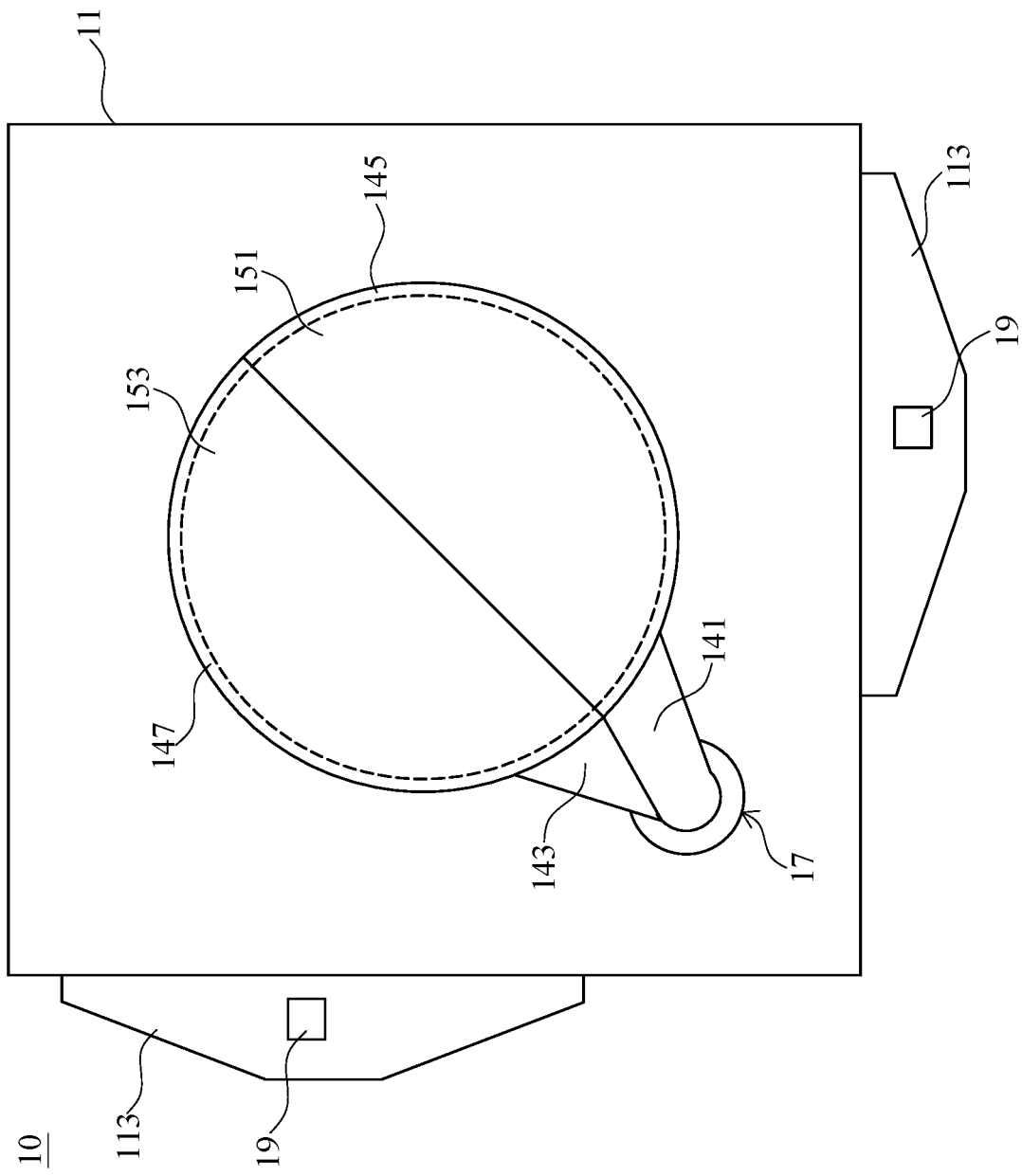
FIG. 8 is a top view of the deposition equipment operating in a shielding state according to an embodiment of this disclosure.

As shown in FIG. 8, the driving device 17 is configured to drive the first shielding plate 151 and the second shielding plate 153 to approach each other and operate in the shielding state. The first shielding plate 151 and the second shielding plate 153 operating in the shielding state may be not in direct contact, and there is a gap between them, wherein the gap may be less than a threshold value, such as less than 1 mm. The first shielding plate 151 and the second shielding plate 153 operating in the shielding state form a complete shield member 15 for isolating the target material 115 and the carrier 13.

In addition, when the first bearing arm 141 and the second bearing arm 143 drive the first shielding plate 151 and the second shielding plate 153 to operate in the shielding state, there is also a gap between the first bearing arm 141 and the second bearing arm 143. For example, there is a gap between the first arc support frame 145 and the second arc support frame 147. Through the above design, the first shielding plate 151 and the second shielding plate 153 operating in the shielding state can be prevented from colliding with each other, or the first arc supporting frame 145 and the second arc supporting frame 147 colliding with each other, resulting in particle pollution.

In one embodiment of the invention, as shown in FIG. 7 and FIG. 8, the reaction chamber 11 may be connected to two sensor areas 113, wherein the sensor area 113 protrudes from the side surface of the reaction chamber 11, and the thickness of the sensor area 113 is smaller than that of the reaction chamber 11. When the first shielding plate 151 and the second shielding plate 153 are operated in the open state, part of the first shielding plate 151 and part of the second shielding plate 153 will enter two sensor areas 113 respectively. Further, the area of the first shielding plate 151 and the second shielding plate 153 located in the sensor area 113 is smaller than that of the first shielding plate 151 and the second shielding plate 153 located in the containing space 12.

The two sensing areas 113 may be respectively disposed on two adjacent side surfaces of the reaction chamber 11, and at least one position sensor 19 is respectively disposed on the two sensor areas 113 for sensing the first shielding plate 151 and the second shielding plate 153 entering the sensing areas 113, so as to determine whether the first shielding plate 151 and the second shielding plate 153 are in an open state, and abnormal collision between the carrier 13, the first shielding plate 151 and the second shielding plate 153 can be avoided. For example, the position sensor 19 may be a light sensing unit.

As shown in FIG. 1 and FIG. 5, the carrier 13 may include a ring member 133 and a plurality of alignment protrusion portions 135, wherein the ring member 133 and the alignment protrusion portions 135 are located around the bearing surface 131 of the carrier 13. For example, the alignment protrusion portions 135 are located outside the ring member 133. In one embodiment of the invention, the ring member 133 may include a plurality of holes, and the alignment protrusion portions 135 passes through the holes of the ring member 133 and protrudes from the upper surface of the ring member 133.

The deposition equipment 10 includes a blocking member 111 and a cover ring 16, wherein one end of the blocking member 111 is connected to the reaction chamber 11, and the other end forms a ring-shaped wall 1111 in the containing space 12. The cover ring 16 is placed on the ring-shaped wall 1111 of the blocking member 111, and at least one alignment concave portion 161 is disposed on the lower surface of the cover ring 16, wherein the alignment concave portions 161 of the cover ring 16 are correspond to the alignment protrusions of the carrier 13.

When the first shielding plate first shielding plate 151 and the second shielding plate 153 are operated in the open state, an elevating unit 18 is configured to drive the carrier 13 to approach the cover ring 16. For example, the elevating unit 18 may be a linear actuator. Thereafter, the alignment concave portions 161 of the cover ring 16 will align with the aligning protrusion portions 135 of the carrier 13, and guides the cover ring 16 to a preset position of the carrier 13 and cover edge of the substrate on the carrier 13.

Figure 9:
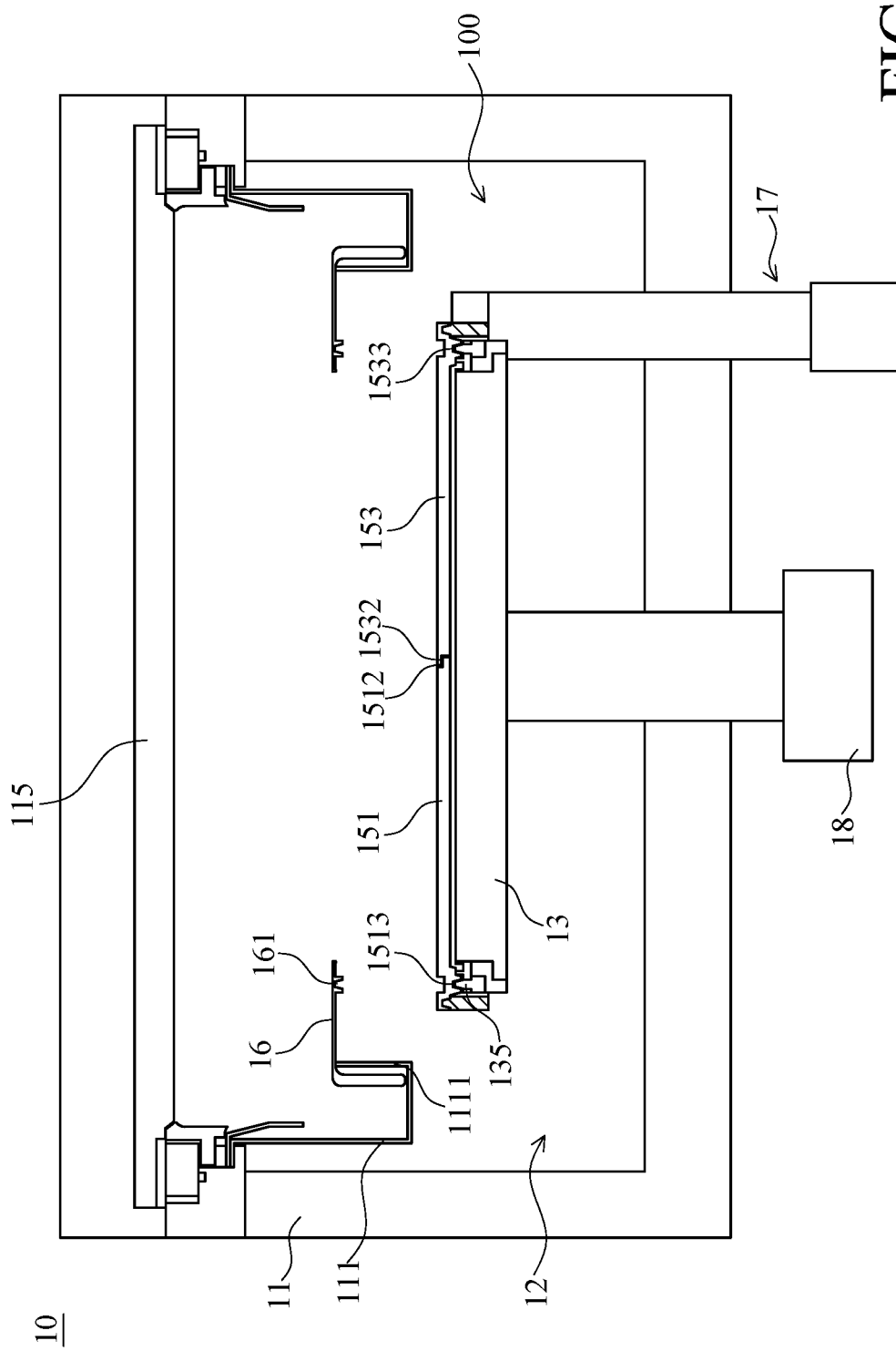
FIG. 9 is a cross section view of a carrier and shielding plates of the deposition equipment according to an embodiment of this disclosure.

As shown in FIGS. 4, 5 and 9, the first alignment concave portions 1513 of the first shielding plate 151 and the second alignment concave portions 1533 of the second shielding plate 153 may both correspond to the alignment protrusion portions 135 of the carrier 13. The elevating unit 18 is configured to drive the carrier 13 to approach the first shielding plate 151 and the second shielding plate 153 operating in the shielding state, wherein the first alignment concave portions 1513 of the first shielding plate 151 and the second alignment concave portions 1533 of the second shielding plate 153 align with the aligning convex portion 135 of the carrier 13 to guide the first shielding plate 151 and the second shielding plate 153 to shield the bearing surface 131 of the carrier 13.

In addition, a protrusion portion 1512 and a recessed portion 1532 may be respectively provided on the facing side surfaces of the first shielding plate 151 and the second shielding plate 153. When the first shielding plate 151 and the second shielding plate 153 operate in the shielding state, the protrusion portion 1512 of the first shielding plate 151 will enter the recessed portion 1532 of the second shielding plate 153, and the protrusion portion 1512 and the recessed portion 1532 overlap each other, so as to improve the shielding effect of the first shielding plate 151 and the second shielding plate 153 on the carrier 13.

Figure 10:
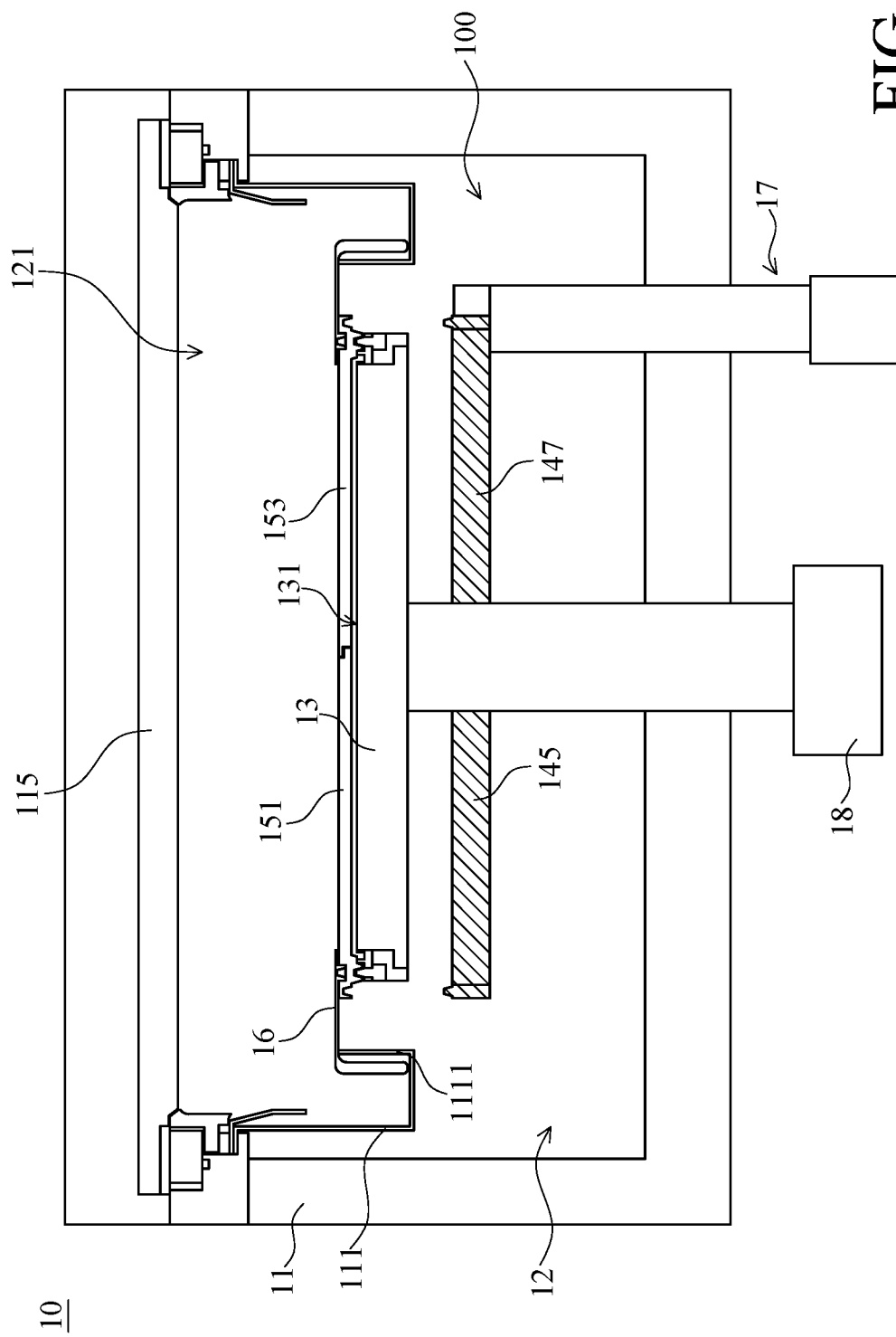
FIG. 10 is a cross section view of the carrier, shielding plates and a cover ring of the deposition equipment according to an embodiment of this disclosure.

As shown in FIG. 10, the elevating unit 18 may continue to drive the carrier 13 and the first shielding plate 151 and the second shielding plate 153 to approach the cover ring 16, and the first shielding plate 151 and the second shielding plate 153 will leave the first arc support frame 145 and the second arc support frame 147. Thereafter, the first shielding plate 151 and the second shielding plate 153 located on the carrier 13 will contact the cover ring 16 on the blocking member 111.

Specifically, the area of the opening 142 formed on the inner side of the first arc support frame 145 and the second arc support frame 147 will be larger than the cross-sectional area of the carrier 13 and/or the area of the bearing surface 131, so that the carrier 13 can pass through the opening 142 and carry the first shielding plate 151 and the second shielding plate 153 to leave the first arc support frame 145 and the second arc support frame 147. For example, the opening 142 and the cross section of the carrier 13 may be circular. The carrier 13 can carry the first shielding plate 151 and the second shielding plate 153 to move toward the cover ring 16, without driving the first bearing arm 141 and the second bearing arm 143 to operate in the open state, which can improve the convenience of use.

As shown in FIG. 2, FIG. 5 and FIG. 10, the lower surface of the cover ring 16 are provided with at least one protrusion 163, and an alignment recess 161 may be formed on the protrusion 163. For example, the protrusion 163 may be annular. The upper surfaces of the first shielding plate 151 and the second shielding plate 153 may be respectively provided with a first arc groove 1515 and a second arc groove 1535, wherein the first arc groove 1515 and the second arc groove 1535 respectively correspond to the protrusion 163 on the lower surface of the cover ring 16.

Specifically, when the first shielding plate 151 and the second shielding plate 153 contact the cover ring 16, the protrusions 163 at the lower surface of the cover ring 16 will enter the first arc groove 1515 of the first shielding plate 151 and the second arc groove 1535 of the second shielding plate 153 to align the first shielding plate 151 and the second shielding plate 153 with cover ring 16.

In another embodiment of the invention, the lower surface of the cover ring 16 may be provided with the alignment concave portion 161, wherein the alignment concave portion 161 is concave inward from the lower surface of the cover ring 16. The first arc groove 1515 of the first shielding plate 151 and the second arc groove 535 of the second shielding plate 153 may be replaced with the first arc protrusion and the second arc protrusion. When the cover ring 16 is connected to the first shielding plate 151 and the second shielding plate 153, the first arc protrusion of the first shielding plate 151 and the second arc protrusion of the second shielding plate 153 will enter the alignment concave portion 161 at the bottom of the cover ring 16.

The first shielding plate 151 and the second shielding plate 153 operating in the shielding state contact the cover ring 16 to separate a cleaning space 121 in the containing space 12. A burn-in process may be performed in the cleaning space 121 to clean the target material 115, the reaction chamber 11 and/or the blocking member 111 in the cleaning space 121, and to remove oxides, nitrides or other contaminants on the surface of the target material 115, and the film deposited on the surface of the reaction chamber 11 and/or the blocking member 111.

The above description is only a preferred embodiment of this disclosure, and is not intended to limit the scope of this disclosure. Modifications should be included within the scope of the patent application of this disclosure.

What is claimed is:

1. A deposition equipment with a shielding mechanism, comprising:
    a reaction chamber including a containing space;
    a carrier located in the containing space, and including a bearing surface and a plurality of alignment protrusion portions, wherein the bearing surface is configured to carry at least one substrate, and the alignment protrusion portions are located around the bearing surface;
    a shielding mechanism, comprising:
        a first bearing arm located in the containing space, and including a plurality of first alignment portions;
        a second bearing arm located in the containing space, and including a plurality of second alignment portions;
        a first shielding plate including a first arc groove or a first arc protrusion located on an upper surface of the first shielding plate, and plurality of third alignment portions and a plurality of first alignment concave portions located on a lower surface of the first shielding plate, wherein the first alignment concave portions are located on an inner side of the third alignment portions, and the third alignment portions and the first alignment concave portions are configured to align the first shielding plate with the first bearing arm;
        a second shielding plate including a second arc groove or a second arc protrusion located on an upper surface of the second shielding plate, and plurality of fourth alignment portions and a plurality of second alignment concave portions located on a lower surface of the second shielding plate, wherein the second alignment concave portions are located on an inner side of the fourth alignment portions, and the fourth alignment portions and the second alignment concave portions are configured to align the second shielding plate with the second bearing arm; and
        a driving device connected to the first bearing arm and the second bearing arm, and driving the first shielding plate and the second shielding plate to swing in opposite directions through the first bearing arm and the second bearing arm respectively, so that the first shielding plate and the second shielding plate being operated in an open state or a shielding state, wherein the first shielding plate and the second shielding plate operating in the shielding state are respectively aligned with the alignment protrusion portions of the carrier through the first alignment concave portions and the second alignment concave portions to shield the bearing surface of the carrier.

2. The deposition equipment with the shielding mechanism according to claim 1, wherein the driving device comprises a shaft seal and at least one motor, and the motor is connected to the first bearing arm and the second bearing member via the shaft seal.

3. The deposition equipment with the shielding mechanism according to claim 2, wherein the shaft seal comprises an outer tube and an inner shaft, and the outer tube comprises an inner space for containing the inner shaft, wherein the outer tube is connected to the first bearing arm and drives the first shielding plate to swing via the first bearing arm, and the inner shaft is connected to the second bearing arm and drives the second shielding plate to swing via the second bearing arm.

4. The deposition equipment with the shielding mechanism according to claim 3, wherein the driving device comprises two motor that are respectively connected to the outer tube and the inner shaft.

5. The deposition equipment with the shielding mechanism according to claim 1, further comprising:
a blocking member located in the containing space, wherein one end of the blocking member is connected to the reaction chamber, and the other end of the blocking member forms a ring-shaped wall; and
a cover ring located on the ring-shaped wall, wherein a lower surface of the cover ring includes at least one alignment concave portion, and the at least one alignment concave portion of the cover ring is configured to align with the plurality of alignment protrusion portions of the carrier.

6. The deposition equipment with the shielding mechanism according to claim 5, wherein the cover ring is connected to the first shielding plate and the second shielding plate, and the first arc protrusion on the upper surface of the first shielding plate and the second arc protrusion on the upper surface of the second shielding plate are located in the at least one alignment concave portion of the cover ring.

7. The deposition equipment with the shielding mechanism according to claim 5, further comprising at least one protrusion located on the lower surface of the cover ring, wherein the at least one protrusion is annular, and when the cover ring connects to the first shielding plate and the second shielding plate, part of the at least one protrusion located on the lower surface of the cover ring will be located in the first arc groove of the first shielding plate and the other part of the at least one protrusion located on the lower surface of the cover ring will be located in the second arc groove of the second shielding plate.

8. The deposition equipment with the shielding mechanism according to claim 5, further comprising a target material located in the containing space of the reaction chamber, and facing the bearing surface of the carrier.

9. The deposition equipment with the shielding mechanism according to claim 8, wherein the first shielding plate and the second shielding plate operating in the shielding state are located between the carrier and the target material to isolate the target material and the carrier.

10. The deposition equipment with the shielding mechanism according to claim 1, wherein the first bearing arm including a first arc support frame for carrying the first shielding plate, and the plurality of first alignment portions are located on the first arc support frame, wherein the second bearing arm including a second arc support frame for carrying the second shielding plate, and the plurality of second alignment portions are located on the second arc support frame.

11. The deposition equipment with the shielding mechanism according to claim 10, wherein the first shielding plate and the second shielding plate are operating in the shielding state and the first arc support frame and the second arc support frame form a ring-shaped support frame.

12. The deposition equipment with the shielding mechanism according to claim 11, wherein an inner side of the ring-shaped support frame formed by the first arc support frame and the second arc support frame has an opening, and an area of the opening is larger an area of the bearing surface of the carrier.

13. The deposition equipment with the shielding mechanism according to claim 11, further comprising an elevating unit connected to and driving the carrier to displace relative to the cover ring.

14. The deposition equipment with the shielding mechanism according to claim 13, where in the elevating unit is configured to drive the carrier to approach the cover ring, and drive the carrier passing through the opening of the ring-shaped support frame to carry the first shielding plate and the second shielding plate leaving the first arc support frame and the second arc support frame.

15. The deposition equipment with the shielding mechanism according to claim 1, wherein the first shielding plate comprises a protrusion portion, and the second shielding plate comprises a recessed portion, wherein the first shielding plate and the second shielding plate is operated in shielding state, and the protrusion portion of the first shielding plate enters the recessed portion of the second shielding plate.

16. The deposition equipment with the shielding mechanism according to claim 1, further comprising two sensor areas connected to the reaction chamber, and a thickness of the two sensor areas being smaller than a thickness of the reaction chamber, wherein at least one position sensor is respectively disposed in the two sensor areas for sensing the first shielding plate and the second shielding plate entering the sensor areas.

17. The deposition equipment with the shielding mechanism according to claim 16, wherein the first shielding plate and the second shielding plate are operating in the open state, and part of the first shielding plate and part of the second shielding plate respectively enter the two sensor areas, wherein an area of the first shielding plate and the second shielding plate located in the sensor area is smaller than the area of the first shielding plate and the second shielding plate located in the containing space.

18. The deposition equipment with the shielding mechanism according to claim 16, wherein the position sensor is a light sensing unit.

19. The deposition equipment with the shielding mechanism according to claim 1, wherein the carrier comprises a ring member that is located around the bearing surface of the carrier.

20. The deposition equipment with the shielding mechanism according to claim 1, wherein the first shielding plate and the second shielding plate operating in shielding state are not in direct contact, and a gap is formed between the first shielding plate and the second shielding plate.

\* \* \* \* \*